(12) United States Patent
Liu et al.

(10) Patent No.: US 8,158,985 B2
(45) Date of Patent: Apr. 17, 2012

(54) THIN FILM TRANSISTOR DEVICES WITH DIFFERENT ELECTRICAL CHARACTERISTICS AND METHOD FOR FABRICATING THE SAME

(75) Inventors: Yu-Chung Liu, Kaohsiung (TW); Te-Yu Lee, Jhubei (TW); Te-Chang Wan, Taipei (TW); Kuo-Chao Chen, Sinwu Township (TW); Mei-Ling Chang, Gongguan Township (TW)

(73) Assignee: Chimei Innolux Corporation, Chu-Nan (TW)

( * ) Notice: Subject to any disclaimer, the term of this patent is extended or adjusted under 35 U.S.C. 154(b) by 222 days.

(21) Appl. No.: 12/651,998

(22) Filed: Jan. 4, 2010

(65) Prior Publication Data
US 2010/0181574 A1    Jul. 22, 2010

(30) Foreign Application Priority Data

Jan. 16, 2009   (TW) ................. 98101494 A

(51) Int. Cl.
*H01L 33/00* (2010.01)
*H01L 29/786* (2010.01)

(52) U.S. Cl. ................. 257/72; 257/59; 257/E29.273; 438/149; 438/585

(58) Field of Classification Search ............ 257/72, 257/59, E29.273, E33.053; 438/149, 34, 438/585
See application file for complete search history.

(56) References Cited

U.S. PATENT DOCUMENTS
2009/0146927 A1   6/2009 Wan et al.

*Primary Examiner* — Evan Pert
*Assistant Examiner* — Selim Ahmed
(74) *Attorney, Agent, or Firm* — Liu & Liu

(57) ABSTRACT

A system for displaying images. The system includes a thin film transistor (TFT) device including a first insulating layer covering a first region and a second region of a substrate. A first polysilicon active layer is disposed in the first region and between the substrate and the first insulating layer. A second polysilicon active layer is disposed on the first insulating layer in the second region. A polysilicon gate layer is disposed above the first polysilicon active layer. A second insulating layer covers the polysilicon gate layer and the second polysilicon active layer. A metal gate layer is disposed above the second polysilicon active layer. A method for fabricating the system for displaying images including the TFT device is also disclosed.

17 Claims, 12 Drawing Sheets

THIN FILM TRANSISTOR DEVICES WITH DIFFERENT ELECTRICAL CHARACTERISTICS AND METHOD FOR FABRICATING THE SAME

CROSS REFERENCE TO RELATED APPLICATIONS

This Application claims priority of Taiwan Patent Application No. 098101494, filed on Jan. 16, 2009, the entirety of which is incorporated by reference herein.

BACKGROUND OF THE INVENTION

1. Field of the Invention

The invention relates to flat panel display technology, and in particular to an organic light-emitting diode (OLED) display comprising a thin film transistor (TFT) device having different electrical characteristics in a peripheral circuit region and an OLED driving region and a method for fabricating the same.

2. Description of the Related Art

The demand for active-matrix flat panel displays, such as active matrix organic light emitting device (AMOLED) displays, has increased rapidly in recent years. AMOLED displays typically employ thin film transistors (TFTs) as a switching element and a driving element as a light-emitting device in a pixel region. Additionally, AMOLED displays also employ a complementary metal oxide semiconductor (CMOS) circuit composed of TFTs in a peripheral circuit region.

Such elements are classified as amorphous silicon (a-Si) TFTs and polysilicon TFTs according to the active layer materials used. Compared with a-Si TFTs, polysilicon TFTs have the advantages of high carrier mobility, high driving-circuit integration and low leakage current, and are often applied to applications that require high-speed operation. Thus, low temperature polysilicon (LTPS) is a novel application for FPD technology. LTPS allows for an easier IC manufacturing process, which integrates driving circuits on a glass substrate having pixels thereon, reducing manufacturing costs.

During the LTPS-TFT fabrication, the TFTs in the peripheral circuit region and the pixel region have substantially the same electrical characteristics. In AMOLED displays, however, the electrical characteristics of the TFTs in the peripheral circuit region and the switching TFTs in the pixel region are different from the driving TFTs in the pixel region. For example, it is desirable to design the former with high carrier mobility and low sub-threshold swing, thereby providing a faster response. Additionally, it is desirable to design the latter with high sub-threshold swing and low threshold voltage to increase gray scale and extend OLED lifespan. However, it is difficult to fabricate TFTs with different electrical characteristics with the LTPS fabrication process.

Additionally, during the LTPS fabrication process, the active layers of TFTs are formed by a high power laser crystallization process. However, since the laser output energy is non-uniform, the driving current of each TFT for driving the OLED varies and thus, induces mura defects in displays.

Therefore, there exists a need in the art for development of an improved TFT device for OLED displays, having different electrical characteristics and capable of eliminating mura defects induced by driving TFTs of OLEDs.

BRIEF SUMMARY OF THE INVENTION

A detailed description is given in the following embodiments with reference to the accompanying drawings. A system for displaying images and a method for fabricating the same are provided. An exemplary embodiment of a system for displaying images comprises a thin film transistor (TFT) device comprising a substrate having a first region and a second region. A first insulating layer covers the first region and the second region of the substrate. A first polysilicon active layer is disposed in the first region and between the substrate and the first insulating layer. A second polysilicon active layer is disposed on the first insulating layer in the second region. A polysilicon gate layer is disposed on the first insulating layer above the first polysilicon active layer. A second insulating layer covers the polysilicon gate layer and the second polysilicon active layer. A metal gate layer is disposed on the second insulating layer above the second polysilicon active layer. A first thin film transistor is constituted by the first polysilicon active layer, the first insulating layer thereon and the polysilicon gate layer thereon, and a second thin film transistor is constituted by the second polysilicon active layer, the second insulating layer thereon and the metal gate layer thereon.

An embodiment of a method for fabricating a system for displaying images, wherein the system comprises a thin film transistor device, comprising providing a substrate having a first region and a second region. A first polysilicon active layer is formed on the first region of the substrate. The first polysilicon active layer and the second region of the substrate are covered by a first insulating layer. A polysilicon gate layer is formed on the first insulating layer in the first region and a second polysilicon active layer is simultaneously formed on the first insulating layer in the second region. The polysilicon gate layer and the second polysilicon active layer are covered by a second insulating layer. A metal gate layer is formed on the second insulating layer above the second polysilicon active layer. The thin film transistor device comprises a first thin film transistor constituted by the first polysilicon active layer, the first insulating layer thereon and the polysilicon gate layer thereon, and comprises a second thin film transistor constituted by the second polysilicon active layer, the second insulating layer thereon and the metal gate layer thereon.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims.

Figure 1:
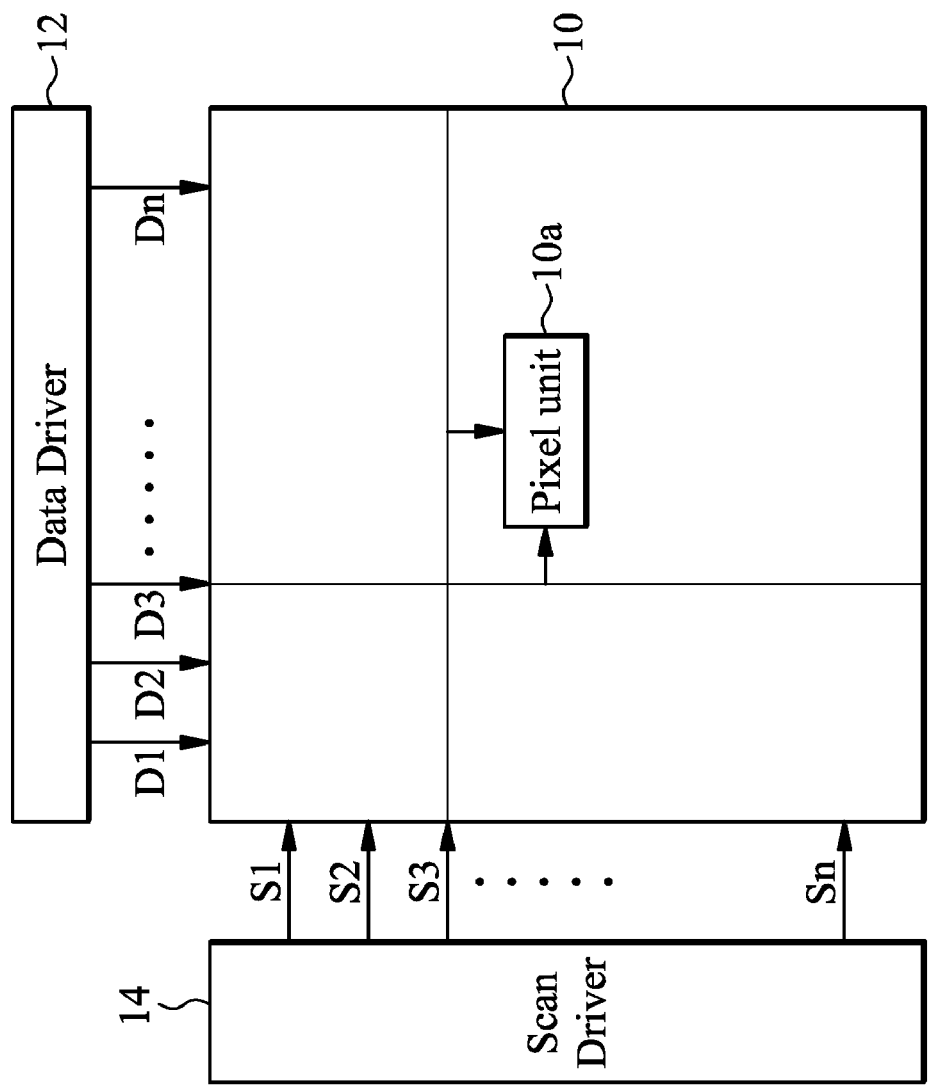
FIG. 1 is a plan view of an active matrix organic light emitting device display.

Referring to FIG. 1, which is a plan view of an active matrix organic light emitting device (AMOLED) display. The AMOLED display comprises a display panel 10, a data driver 12, and a scan driver 14. The display panel 10 includes a plurality of pixel units and only one pixel unit 10a is depicted in order to simplify the diagram. The data driver 12 may comprise a plurality of data lines D1 to Dn, and the scan driver 14 may include a plurality of scan lines S1 to Sn. Each pixel unit 10a is connected to one data line and one scan line (e.g. the data line D3 and the scan line S3) so as to be arranged as a matrix.

Figure 2:
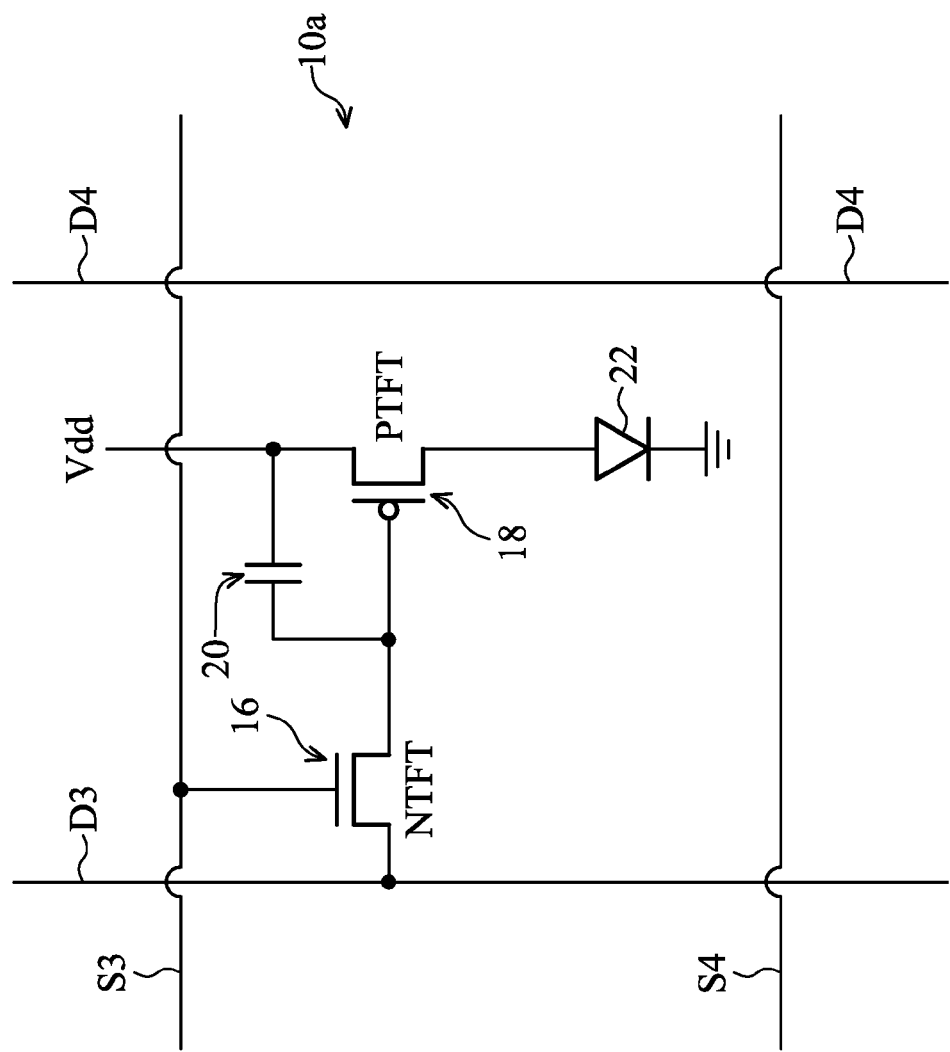
FIG. 2 is a circuit diagram of a pixel unit in FIG. 1.

Referring to FIG. 2, which illustrates a circuit diagram of a pixel unit 10a in FIG. 1. Typically, a pixel unit comprises a driving TFT for driving a light-emitting device, a switching TFT for changing the state of the pixel unit, and a storage capacitor for storing image data. In the embodiment, the pixel unit 10a comprises a light-emitting device 22 such as an organic light-emitting diode, and a driving TFT 18, which is typically a P-type TFT (PTFT) for driving the light-emitting device 22. The pixel unit 10a further comprises a switching TFT 16, which is typically an N-type TFT (NTFT), and a storage capacitor 20. The switching TFT 16 has a gate connected to the corresponding scan line S3, drain connected to the corresponding data line D3, and a source connected between one terminal of the storage capacitor 20 and the gate of the driving TFT 18. Another terminal of the storage capacitor 20 is connected to the source of the driving TFT 18, which is connected to power source Vdd. The drain of the driving TFT 18 is connected to the light-emitting device 22.

As set forth, the uniformity of the driving TFT 18 in the pixel unit 10a is a concern when fabricating AMOLED displays due to mura defects in the display. However, high performance is required for the switching TFT 16 and the TFTs used in the peripheral circuits. In other words, the demand of electrical characteristics for the driving TFT 18 is different from that for the switching TFT 16 and the TFTs used in the peripheral circuits.

Systems for displaying images and fabrication methods for same are provided. FIG. 3I illustrates an exemplary embodiment of such a system. Specifically, the system incorporates a thin film transistor (TFT) device 400. In the embodiment, one region of a glass substrate is utilized for fabrication of the NTFTs and the PTFTs in the peripheral circuits or the switching TFTs (e.g. NTFTs) in the pixel regions, and another region of a glass substrate is utilized for fabrication of the driving TFTs (e.g. PTFTs) in the pixel regions. Hereinafter, the TFTs in the peripheral circuits and the switching TFTs (e.g. NTFTs) in the pixel regions are referred to as "non-driving TFTs".

The TFT device 400 comprises a substrate 300 having a first region 100 and a second region 200. A buffer layer 302, which may comprise silicon oxide, silicon nitride, or a combination thereof, may be optionally disposed on the substrate 300 to serve as an adhesion layer or a contamination barrier layer between the substrate 300 and the subsequent active layer.

A polysilicon active layer 306 is disposed on the buffer layer 302 in the first region 100, and polysilicon active layers 314 and 316 are disposed on the buffer layer 302 in the second region 200. In the embodiment, the polysilicon active layer 306 has a grain size different from that of the polysilicon active layers 314 and 316. For example, the polysilicon active layer 306 has a grain size smaller than that of the polysilicon active layers 314 and 316. The polysilicon active layer 306 comprises a channel region and a pair of source/drain regions 306b separated by the channel region. Also, the polysilicon active layer 314 comprises a channel region and a pair of source/drain regions 314a separated by the channel region and polysilicon active layer 316 comprises a channel region and a pair of source/drain regions 316b separated by the channel region.

An insulating layer 308 covers the first region 100 and the second region 200 of the substrate 300. Specifically, the insulating layer 308 in the first region 100 covers the polysilicon active layer 306 and serves as a gate dielectric layer. The insulating layer 308 in the second region 200 is interposed between the substrate 300 and the polysilicon active layers 314 and 316.

A polysilicon gate layer 312, which is disposed on the insulating layer 308 above the polysilicon active layer 306, is formed of the same polysilicon layer as the polysilicon active layers 314 and 316. In other words, the polysilicon gate layer 312 and the polysilicon active layers 314 and 316 are formed by patterning a polysilicon layer.

An insulating layer 318 covers the polysilicon gate layer 312 and the polysilicon active layers 314 and 316, in which the insulating layer 318 on the polysilicon active layers 314 and 316 also serves as a gate dielectric layer. Metal gate layers 322 and 324 are respectively disposed on the insulating layer 318 corresponding to the polysilicon active layers 314 and 316.

In the embodiment, a thin film transistor is constructed by the polysilicon active layer 306, the insulating layer 308, and the polysilicon gate layer 312 in the first region 100 and is utilized as a driving TFT for the light-emitting device of the AMOLED display. Moreover, two TFTs are constructed by the polysilicon active layers 314 and 316, the insulating layer 318, and the metal gate layers 322 and 324 in the second region 200 and are utilized as non-driving TFTs (i.e. the switching TFT and the TFT in the peripheral circuits). It is noted that the actual number of the TFTs in the first and second regions 100 and 200 are based on the desired circuit design and is not limited to the exemplary three TFTs shown in FIG. 3I.

Figure 3A:
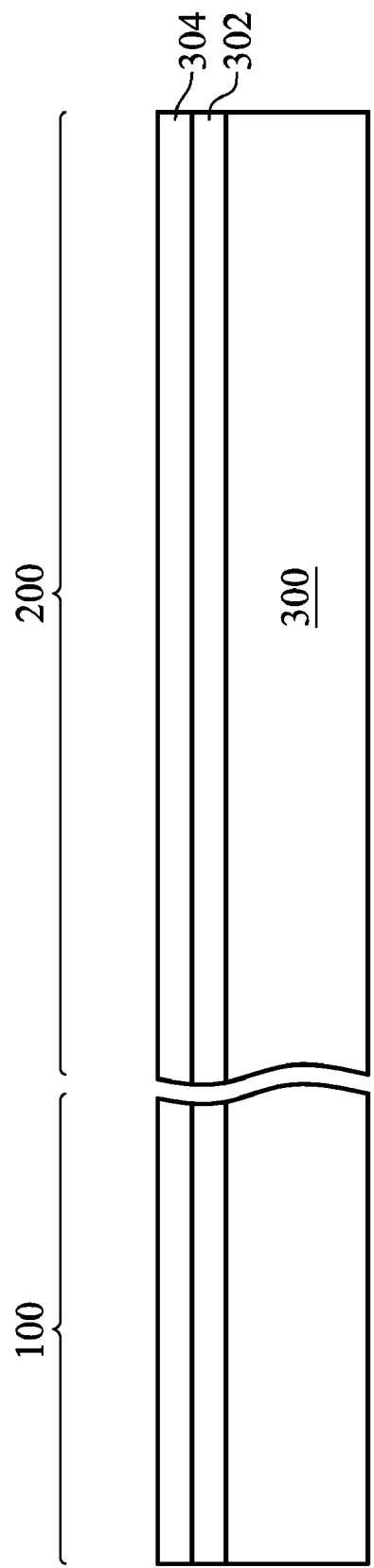
FIGS. 3A to 3I are cross sections of an embodiment of a method for fabricating a system for displaying images including a thin film transistor device according to the invention.
Figure 3B:
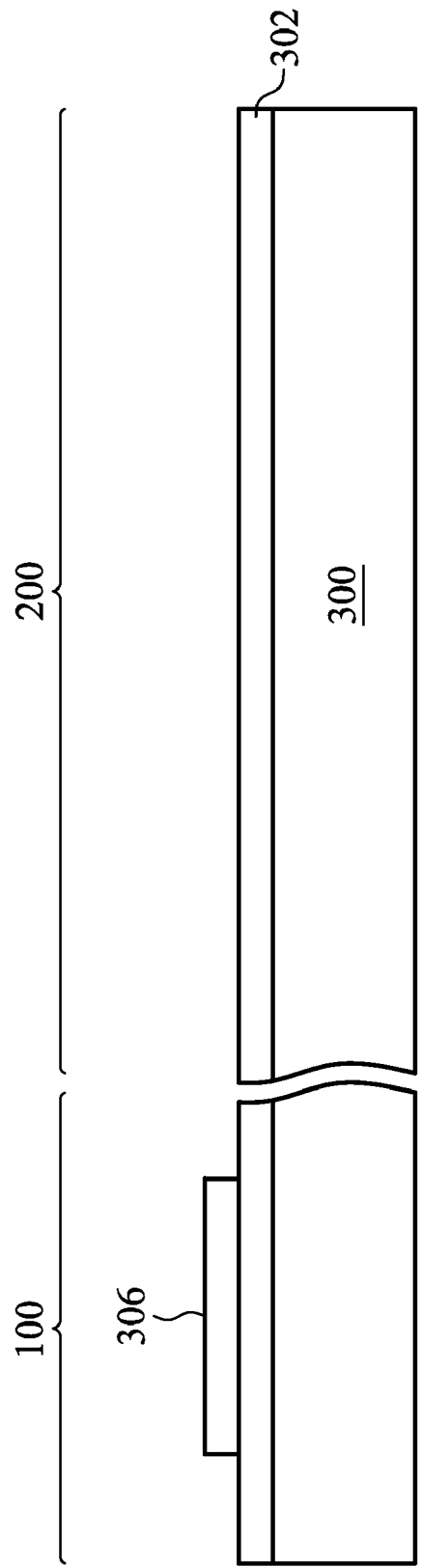
Figure 3C:
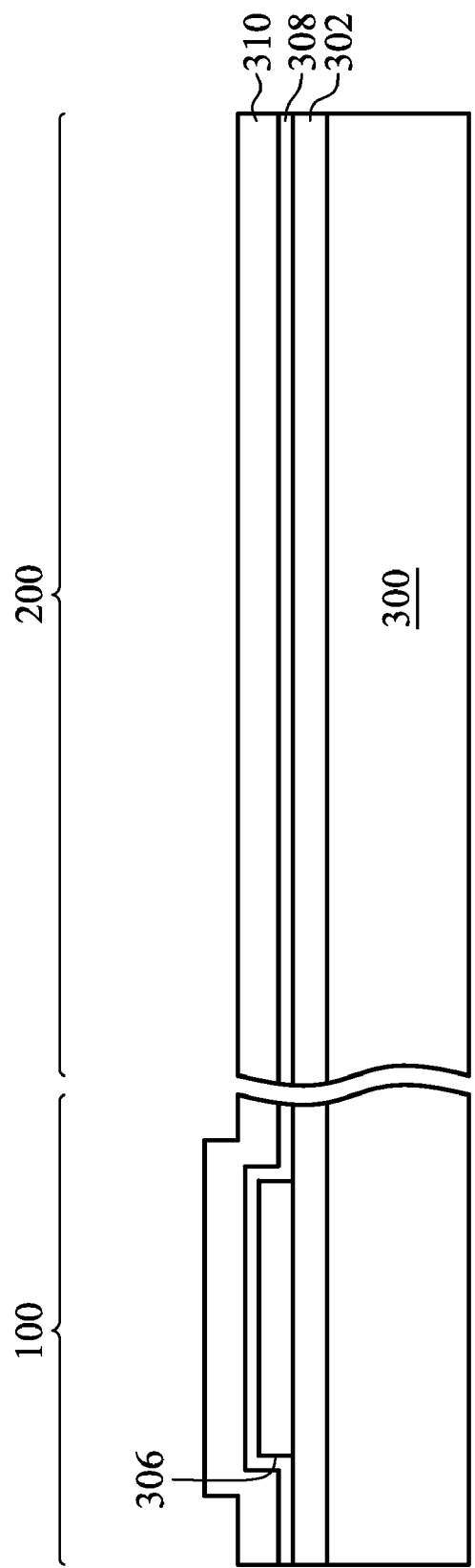
Figure 3D:
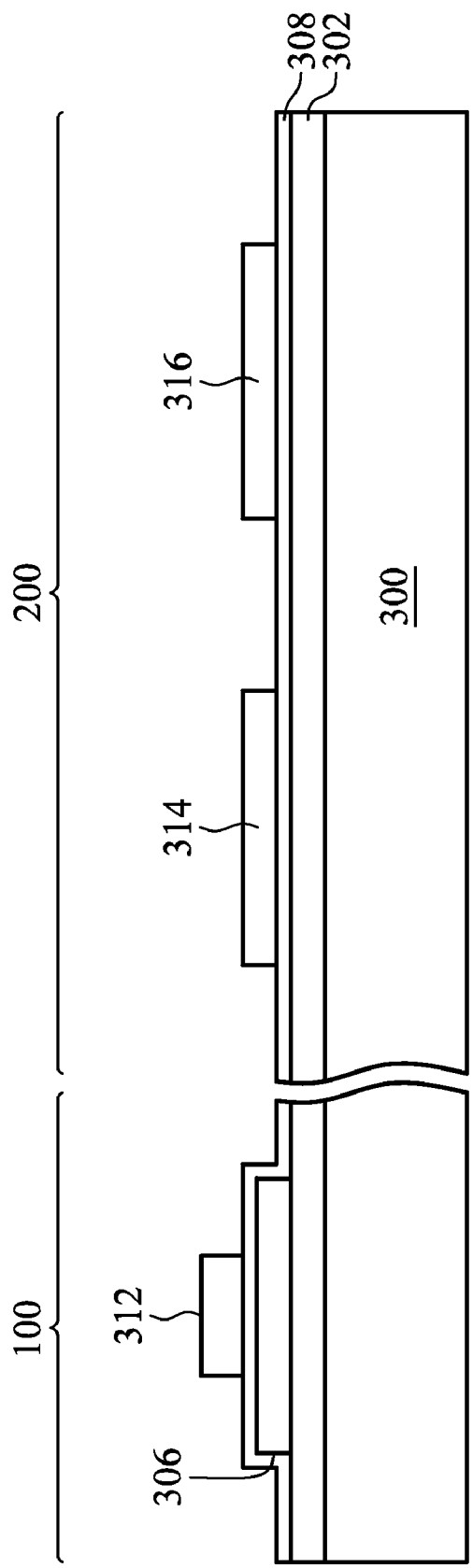
Figure 3E:
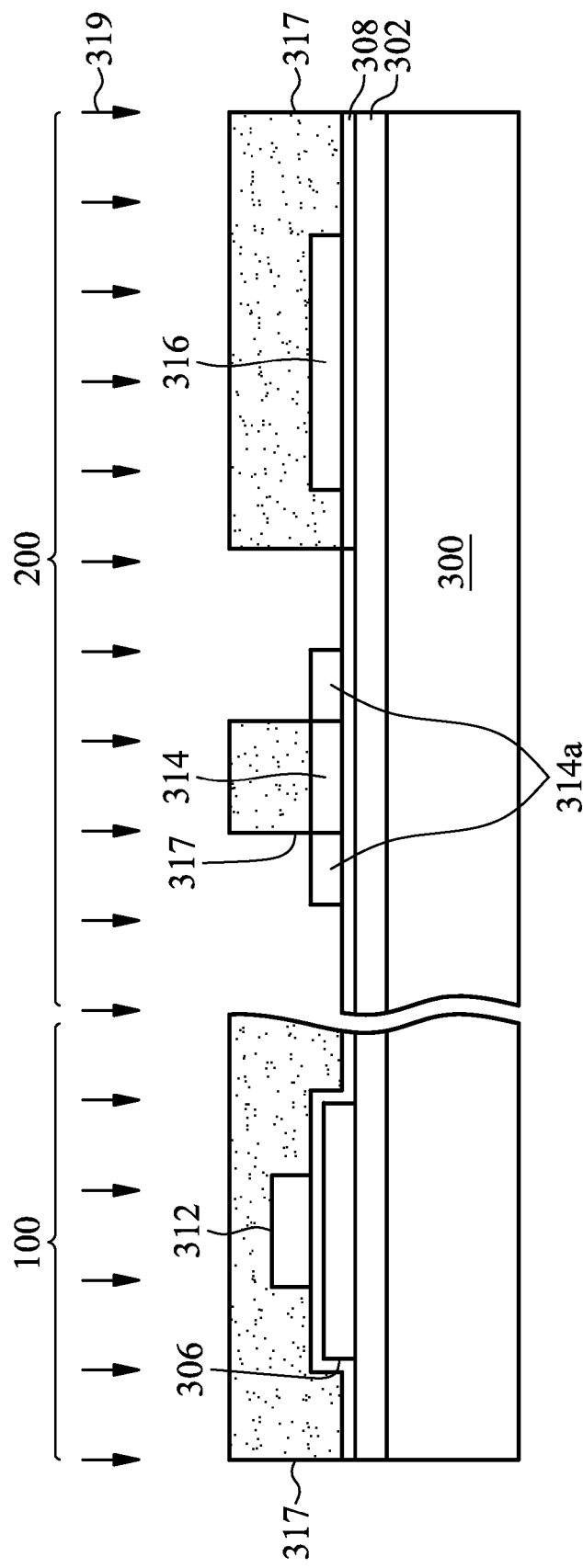
Figure 3F:
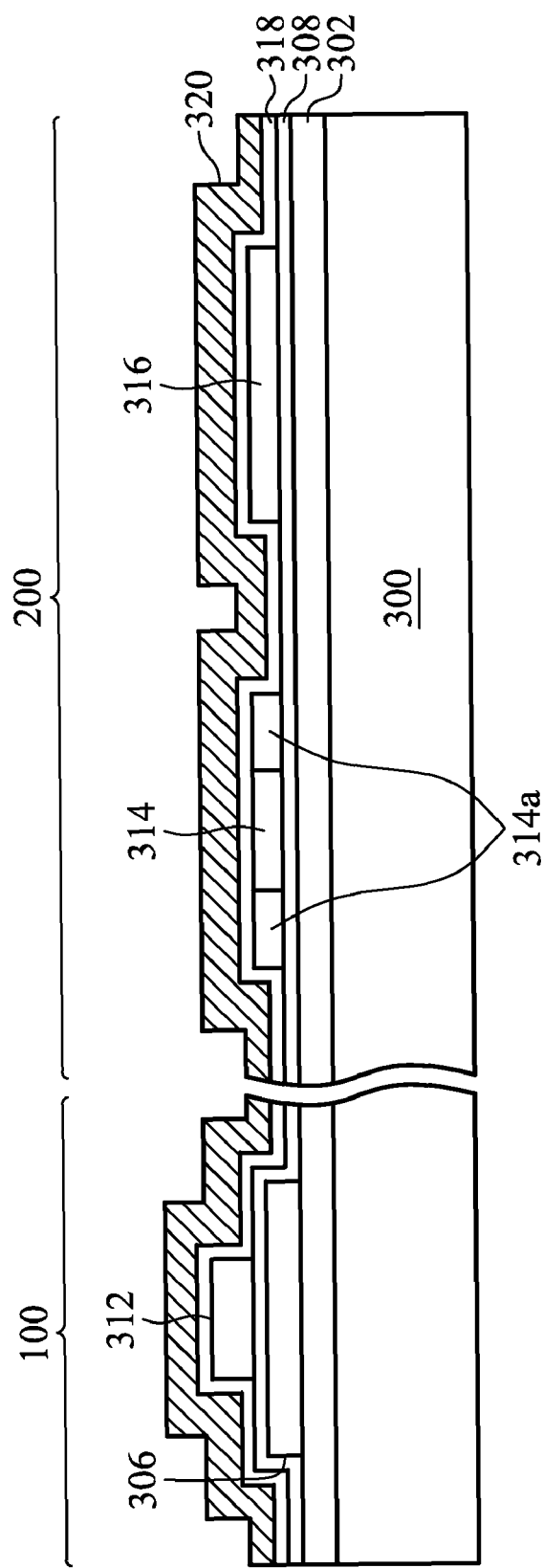
Figure 3G:
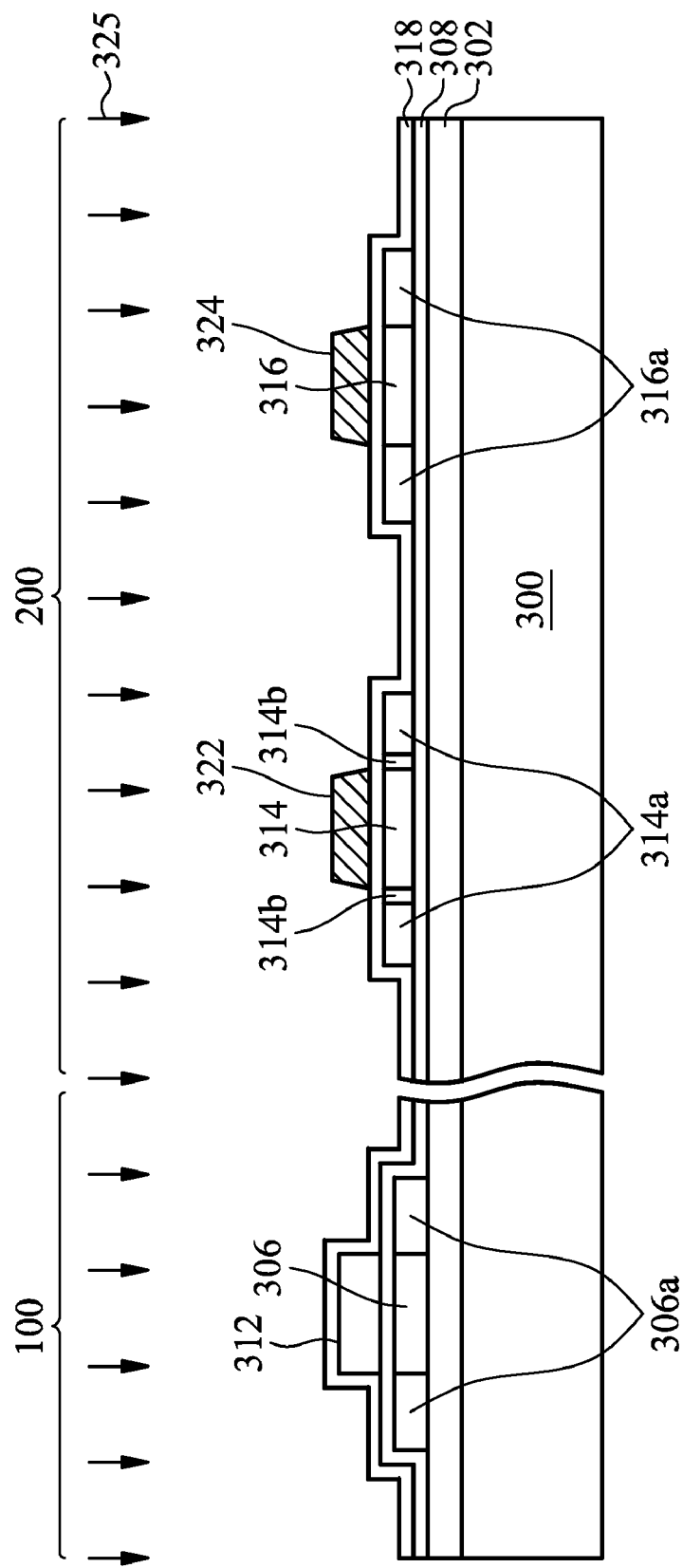
Figure 3H:
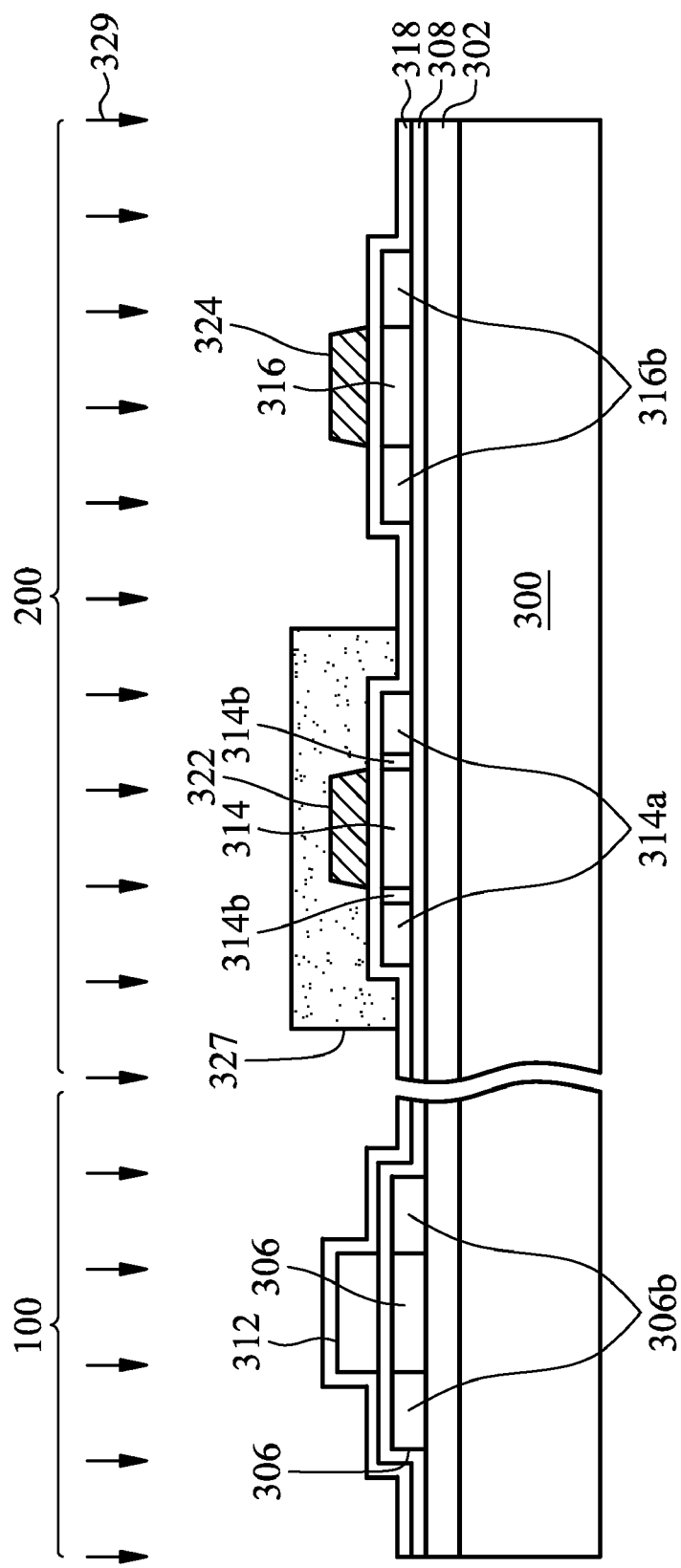
Figure 3I:
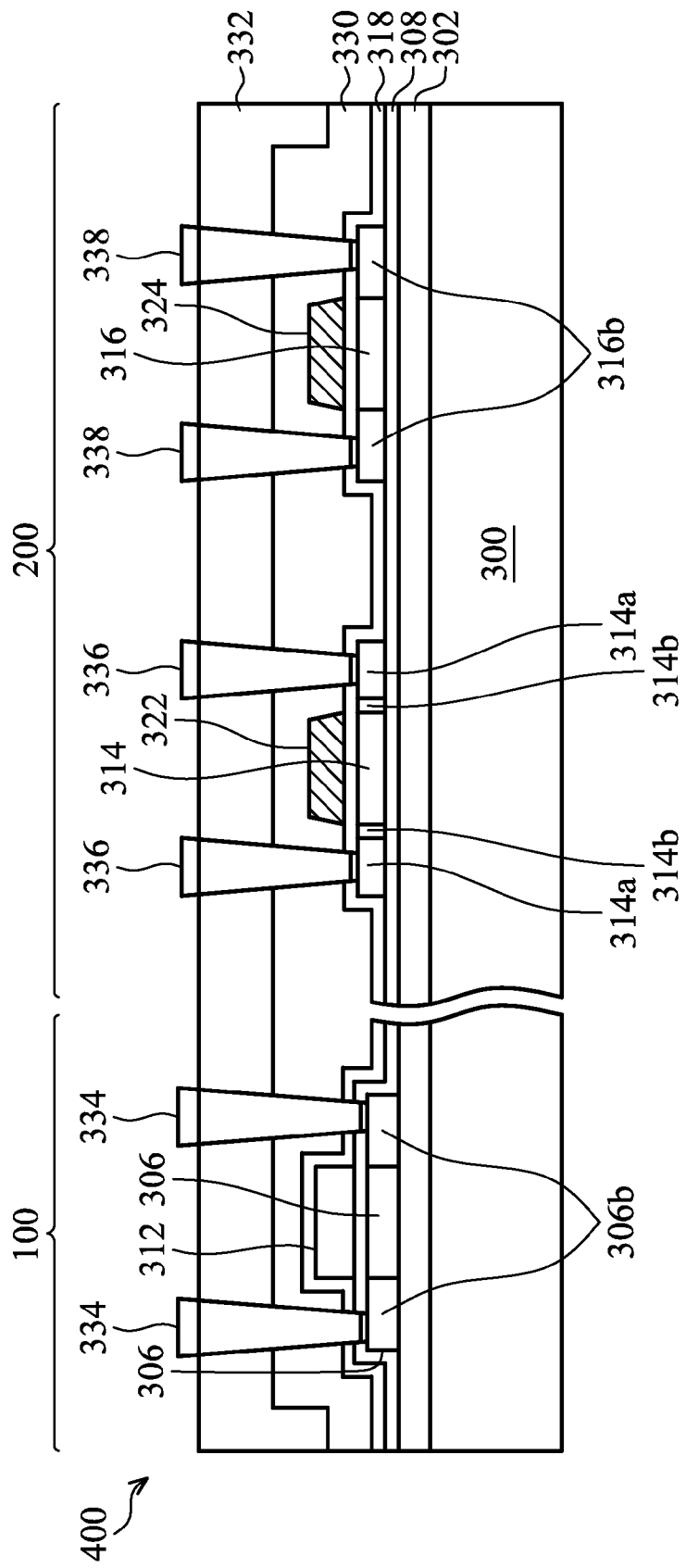

Referring to FIGS. 3A to 3I, which illustrate an embodiment of a method for fabricating a system for displaying images incorporating a thin film transistor device 400. In FIG. 3A, a substrate 300 having a first region 100 and a second region 200 is provided. In the embodiment, the first region 100 is used for fabrication of the driving TFT. The left side of the second region 200 is used for fabrication of the non-driving NTFT, and the right side of the second region 200 is used for fabrication of the non-driving PTFT. The substrate 300 may comprise glass, quartz, or other transparent materials.

Next, a buffer layer 302 may be optionally formed on the substrate 300. An amorphous silicon layer (not shown) is subsequently formed on the buffer layer 302 and then a crystallization process is performed to transfer the amorphous silicon layer into a polysilicon layer 304. In the embodiment, the polysilicon layer 304 is formed by performing the crystallization process such as a non-laser crystallization process. For example, the non-laser crystallization process may comprise solid phase crystallization (SPC), metal induced crystallization (MIC), metal induced lateral crystallization (MILC), field enhanced metal induced lateral crystallization (FE-MILC), or field enhanced rapid thermal annealing process. It is noted that the various crystallization processes mentioned above are exemplary embodiments and the invention is not limited thereto.

In FIG. 3B, the polysilicon layer 304 is patterned by conventional lithography and etching processes to form a polysilicon active layer 306 on the first region 100 of the substrate 300.

In FIG. 3C, an insulating layer 308 is formed on the first and second regions 100 and 200 of the substrate 300 and covers the polysilicon active layer 306. The insulating layer 308 may comprise silicon oxide, silicon nitride, or other gate dielectric materials well known in the art. Next, an amorphous silicon layer (not shown) is subsequently formed on the insulating layer 308 and then a crystallization process is performed to transfer the amorphous silicon layer into a polysilicon layer 310. Specifically, unlike the polysilicon layer 304, the polysilicon layer 310 is formed by a high power laser crystallization (i.e. standard laser crystallization) process using the insulating layer 308 as an isolating layer (spacer). The laser crystallization process may be an excimer laser annealing (ELA) process.

In FIG. 3D, the polysilicon layer 310 is patterned to form a polysilicon gate layer 312 on the insulating layer 308 in the first region 100 and corresponding to the polysilicon active layer 306, and simultaneously form polysilicon active layers 314 and 316 on the insulating layer 308 in the second region 200. Since the polysilicon active layer 306 in the first region 100 is formed by a crystallization process different from that for formation of the polysilicon active layers 314 and 316 in the second region 200, the polysilicon active layer 306 has a grain size different from that of the polysilicon active layers 314 and 316. For example, the grain size of the polysilicon active layers 314 and 316 formed by ELA is greater than that of the polysilicon active layer 306 formed by the non-laser crystallization process.

In FIG. 3E, a photoresist pattern layer 317 is formed on the structure shown in FIG. 3D by the conventional lithography process for defining source/drain regions in the polysilicon active layer 314. Next, a heavy ion implantation process 319 is performed on the polysilicon active layer 314 using the photoresist pattern layer 317 as an implant mask to form N-type source/drain regions 314a in the polysilicon active layer 314.

In FIG. 3F, after removal of the photoresist pattern layer 317, an insulating layer 318 and a metal layer 320 are successively formed on the insulating layer 308 and covers the polysilicon gate layer 312 and the polysilicon active layers 314 and 316. The insulating layer 318 may also comprise silicon oxide, silicon nitride, or other gate dielectric materials well known in the art. Moreover, the metal layer 320 may comprise molybdenum (Mo), an alloy thereof, or other metal gate materials well known in the art.

In FIG. 3G, the metal layer 320 is patterned by a conventional lithography and etching processes to form metal gate layers 322 and 324 on the insulating layer 318 corresponding to the polysilicon active layers 314 and 316. Next, a light ion implantation process 325 is performed on the polysilicon active layers 314 and 316 using the metal gate layers 322 and 324 as implant masks to form N-type lightly doped drain (LDD) regions 314b in the polysilicon active layer 314, and form lightly doped source/drain regions 306a and 316a in the polysilicon active layers 306 and 316, respectively. Additionally, after performing the light ion implantation process 325, the polysilicon gate layer 312 transforms into an N-type polysilicon gate layer. Here, a non-drive NTFT is constructed by the polysilicon active layer 314, the insulating layer 318, and the metal gate layer 322 in the second region 200. In the embodiment, such a non-drive NTFT may serve as a switching TFT.

In FIG. 3H, the non-drive NTFT is covered by a photoresist pattern layer 327 by a conventional lithography process. Next, a heavy ion implantation process 329 is performed on the polysilicon active layers 306 and 316 using the photoresist pattern layer 327 as an implant mask to form P-type source/drain regions 306b and 316b in the polysilicon active layers 306 and 316, respectively. Here, a drive PTFT is constructed by the polysilicon active layer 306, the insulating layer 308, and the polysilicon gate layer 312 in the first region 100. Moreover, a non-drive PTFT is constructed by the polysilicon active layer 316, the insulating layer 318, and the metal gate layer 324 in the second region 200. In the embodiment, such a non-drive PTFT may serve as a TFT used in the peripheral circuits.

In FIG. 3I, after removal of the photoresist pattern layer 327, insulating layers 330 and 322 are successively formed on the structure shown in FIG. 3H to serve as a protective, planarization, or intervening layer or a combination thereof. The insulating layers 330 and 322 may comprise silicon oxide, silicon nitride, or a combination thereof. Thereafter, contact holes are formed in the insulating layers 330 and 322 by conventional lithography and etching processes to expose the source/drain regions 306b, 314a, and 316b. The contact holes are filled with a conductive material, such as aluminum (Al), molybdenum (Mo), titanium (Ti) or a combination thereof, to form electrodes 334, 336, and 338 corresponding to the source/drain regions 306b, 314a, and 316b. As a result, the TFT device 400 of the embodiment is completed.

According to the embodiment, since the active layer of the driving TFT is formed by a non-laser crystallization process, the mura defects in the display can be prevented. Moreover, since the TFT used in the peripheral circuits and the switching TFT requiring high performance are formed by a laser crystallization process, device performance can be maintained. In other words, since the active layers formed by different crystallization processes have different grain sizes, the electrical characteristic of the driving TFT can be different from that of the TFT used in the peripheral circuits and the switching TFT. Additionally, since the gate of driving TFT is formed of polysilicon, which has a work function typically less than that of the metal gate, the threshold voltage of the driving TFT can be reduced and the driving current thereof can be increased, thereby increasing the lifespan of OLEDs.

Figure 4:
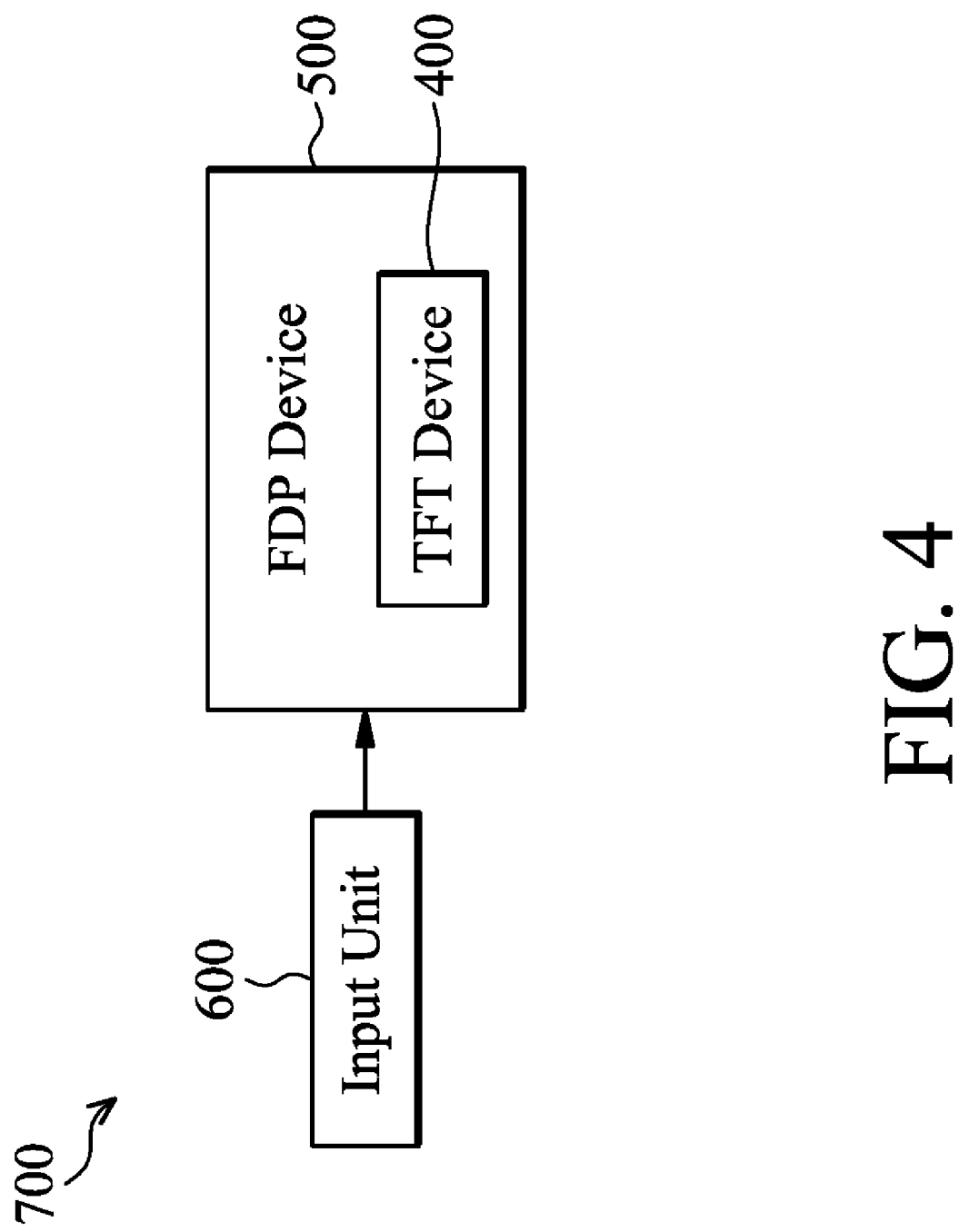
FIG. 4 schematically shows another embodiment of a system for displaying images.

FIG. 4 schematically shows another embodiment of a system for displaying images which, in this case, is implemented as a flat panel display (FPD) device 500 or an electronic device 700 such as a laptop computer, a mobile phone, a digital camera, a personal digital assistant (PDA), a desktop computer, a television, a car display or a portable DVD player. The described TFT device 400 can be incorporated into the flat panel display device 500 that can be an OLED device. In some embodiments, the TFT device 400 can be incorporated into the electronic device 700. As shown in FIG. 4, the electronic device 700 comprises the FPD device 500 and an input unit 600. Moreover, the input unit 600 is coupled to the FPD device 500 and operative to provide input signals (e.g. image signals) to the FPD device 500 to generate images.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:
a thin film transistor device, comprising:
a substrate having a first region and a second region;
a first insulating layer covering the first region and the second region of the substrate;
a first polysilicon active layer disposed in the first region and between the substrate and the first insulating layer;
a second polysilicon active layer disposed on the first insulating layer in the second region;

a polysilicon gate layer disposed on the first insulating layer above the first polysilicon active layer;

a second insulating layer covering the polysilicon gate layer and the second polysilicon active layer; and a metal gate layer disposed on the second insulating layer above the second polysilicon active layer, wherein a first thin film transistor is constituted by the first polysilicon active layer, the first insulating layer thereon and the polysilicon gate layer thereon, and a second thin film transistor is constituted by the second polysilicon active layer, the second insulating layer thereon and the metal gate layer thereon.

2. The system of claim 1, wherein the first polysilicon active layer has a grain size different from that of the second polysilicon active layer.

3. The system of claim 2, wherein the grain size of the second polysilicon active layer is greater than that of the first polysilicon active layer.

4. The system of claim 3, further comprising a buffer layer covering the substrate, comprising silicon oxide, silicon nitride or a combination thereof.

5. The system of claim 1, wherein the second polysilicon active layer and the polysilicon gate layer are formed of the same polysilicon layer.

6. The system as claimed in claim 1, further comprising:
a flat panel display device comprising the thin film transistor device; and
an input unit coupled to the flat panel display device and operative to provide input to the flat panel display device, such that the flat panel display device displays images.

7. The system of claim 6, wherein the flat panel display device is an organic light-emitting diode display, the second thin film transistor is used in a peripheral circuit or used as a switching transistor, and the first thin film transistor is used as a driving transistor for a light-emitting device.

8. The system of claim 6, wherein the system comprises an electronic device comprising the flat panel display device.

9. The system of claim 8, wherein the electronic device is a laptop computer, a mobile phone, a digital camera, a personal digital assistant, a desktop computer, a television, a car display or a portable DVD player.

10. A method for fabricating a system for displaying images, wherein the system comprises a thin film transistor device, comprising:
providing a substrate having a first region and a second region;
forming a first polysilicon active layer on the first region of the substrate;
covering the first polysilicon active layer and the second region of the substrate with a first insulating layer;
forming a polysilicon gate layer on the first insulating layer in the first region and simultaneously forming a second polysilicon active layer on the first insulating layer in the second region;
covering the polysilicon gate layer and the second polysilicon active layer with a second insulating layer; and
forming a metal gate layer on the second insulating layer above the second polysilicon active layer,
wherein the thin film transistor device comprises a first thin film transistor constituted by the first polysilicon active layer, the first insulating layer thereon and the polysilicon gate layer thereon, and comprises a second thin film transistor constituted by the second polysilicon active layer, the second insulating layer thereon and the metal gate layer thereon.

11. The method of claim 10, wherein the first polysilicon active layer has a grain size different from that of the second polysilicon active layer.

12. The method of claim 11, wherein the grain size of the second polysilicon active layer is greater than that of the first polysilicon active layer.

13. The method of claim 10, further forming a buffer layer on the substrate prior to formation of the first polysilicon active layer, wherein the buffer layer comprises silicon oxide, silicon nitride or a combination thereof.

14. The method of claim 10, wherein the first polysilicon active layer and the second polysilicon active layer are formed by different crystallization processes.

15. The method of claim 14, wherein the first polysilicon active layer is formed by a non-laser crystallization process comprising a solid phase crystallization, metal induced crystallization, metal induced lateral crystallization, field enhanced metal induced lateral crystallization, or field enhanced rapid thermal annealing process.

16. The method of claim 14, wherein the second polysilicon active layer and the polysilicon gate layer are formed by excimer laser annealing.

17. The method of claim 10, wherein the thin film transistor device is used in an organic light-emitting diode display, the second thin film transistor is used in a peripheral circuit of the organic light-emitting diode display or used as a switching transistor of the organic light-emitting diode display, and the first thin film transistor is used as a driving transistor for a light-emitting device of the organic light-emitting diode display.

* * * * *